United States Patent [19]
Reekstin et al.

[11] 4,193,687
[45] Mar. 18, 1980

[54] HIGH RESOLUTION ALIGNMENT TECHNIQUE AND APPARATUS

[75] Inventors: John P. Reekstin, Orange; Sigfried G. Plonski, Santa Ana; Addison B. Jones, Yorba Linda, all of Calif.

[73] Assignee: Rockwell International Corporation, El Segundo, Calif.

[21] Appl. No.: 912,612

[22] Filed: Jun. 5, 1978

[51] Int. Cl.$^2$ .............................................. G01B 11/27
[52] U.S. Cl. ............................... 356/150; 250/237 G; 356/401
[58] Field of Search .............................. 356/401, 150; 250/237 G

[56] References Cited
U.S. PATENT DOCUMENTS

| | | | |
|---|---|---|---|
| 3,688,570 | 9/1972 | Burke | 250/237 G |
| 3,806,254 | 4/1974 | Ha et al. | 250/237 G |
| 4,047,585 | 9/1977 | Dlugos | 250/237 G |
| 4,074,131 | 2/1978 | Schwebel | 250/237 G |

OTHER PUBLICATIONS

Oster et al., "Moire' Patterns," *Scientific American*, May 1963, pp. 54–63.

*Primary Examiner*—F. L. Evans
*Assistant Examiner*—R. A. Rosenberger
*Attorney, Agent, or Firm*—H. Fredrick Hamann; Richard A. Bachand

[57] ABSTRACT

There is provided a technique and apparatus for aligning a mask to a substrate with high precision using Moire' fringe effects produced by superimposing diffraction gratings. The gratings comprise first and second patterns of horizontal and vertical lines and spaces, respectively. The first pattern comprises horizontal and vertical lines and spaces of a first width. The second pattern comprises horizontal and vertical lines of a second width which differs from the lines in the first pattern by a small amount Δ. The patterns are superimposed to provide a Moire' fringe effect. When alignment occurs, a symmetrical pattern is provided. If misalignment in the X, Y or θ coordinate occurs, an assymmetrical or skewed pattern of Moire' fringe effects is generated.

11 Claims, 6 Drawing Figures

HIGH RESOLUTION ALIGNMENT TECHNIQUE AND APPARATUS

BACKGROUND OF THE INVENTION

1. Field of the Invention

This invention relates to alignment techniques, in general, and to alignment techniques which exhibit extremely high precision while utilizing relatively simple techniques, in particular.

2. Prior Art

With the advent of semiconductor devices, especially submicron devices, alignment techniques become more and more critical. In view of the reduced sizes, it is highly desirable to obtain as precise alignment as possible. In many applications of current technology, the devices are on the micron of submicron level. Consequently, the alignment must be equally as precise. There have been many concepts proposed for establishing alignment techniques and apparatus. These techniques include optical techniques, shadow masks and many other devices. However, the quest continues for apparatus and techniques which permit the submicron alignment with precision.

SUMMARY OF THE INVENTION

An alignment techniques and apparatus comprising two patterns which are superimposed upon each other is provided. One pattern is placed on the substrate while the other pattern is placed on the mask. One of the patterns includes horizontal and vertical lines of a specified width d. The other pattern comprises horizontal and vertical lines of width $d+\Delta$. The superposition of the patterns produces Moire fringe effects. A prescribed pattern of Moiré fringe effects is defined when the first and second patterns are aligned. Different patterns are produced when the first and second patterns are misaligned. The misaligned patterned varies so as to indicate whether the misalignment is an X, Y, or $\theta$ direction coordinate.

DESCRIPTION OF A PREFERRED EMBODIMENT

Figure 1:
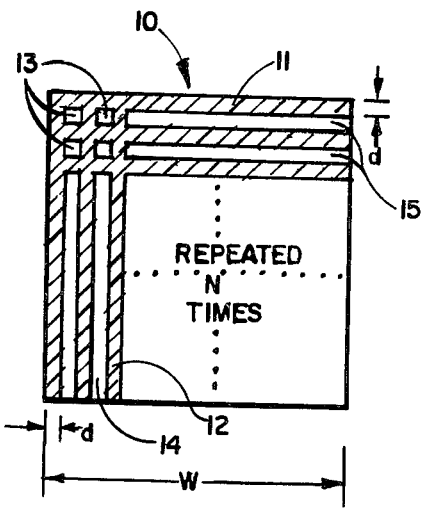
FIG. 1 is a representation of a first pattern having horizontal and vertical lines having width d.

Referring now to FIG. 1, there is shown a schematic representation of a first pattern 10 used in the instant apparatus and technique. The pattern is disposed upon either the substrate or mask which is used in the processing technique. The material of the mask or substrate is determined by the process which is involved. The pattern is substantially square in configuration being of length and width w. In addition, pattern 10 includes a plurality of vertical lines 12 separated by spaces 14. Also, a plurality of horizontal lines 11 separated by spaces 15 are established in the pattern. The vertical lines and spaces have a width d. Likewise, the horizontal lines and spaces have a width d. By repeating the lines and spaces N time, the checkerboard-like pattern is produced in pattern 10. The checkerboard pattern includes the crossed horizontal and vertical lines 11 and 12, respectively, which produce a plurality of squares 13 therebetween. The squares 13 have length and width d.

Figure 2:
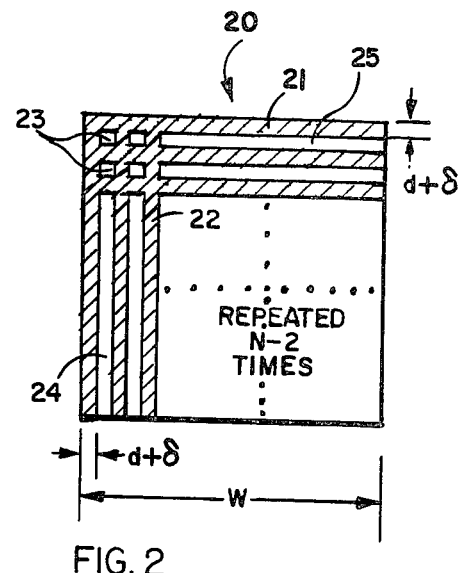
FIG. 2 is a representation of a second pattern with horizontal and vertical lines having $d+\Delta$.

Referring now to FIG. 2, there is shown pattern 20 which has a substantially square configuration also having length and width w which is the same as pattern 10. Also, pattern 20 includes a plurality of vertical lines 22 and horizontal lines 21 which are produced in the pattern in any suitable manner. Likewise, spaces 24 and 25 are provided between vertical lines 22 and horizontal lines 21, respectively. This pattern of lines and spaces produces a checkerboard effect with a plurality of squares 23 defined by the horizontal and vertical lines, respectively.

In pattern 20 the lines and spaces have a width $d+\Delta$. The pattern is repeated N-2 times wherein patterns similar to that in pattern 10 is provided but the lines and spaces are offset by a small amount $\Delta$ which is cumulative.

It can be shown that the $\Delta$ can be defined in terms of the line/space width d as follows:

$$\Delta = d[(N/N-2)-1].$$

Obviously, as N increase, $\Delta$ decreases as a function of the line/space width d.

The patterns 10 and 20 are placed on the substrate and mask (or vice versa) and arranged to be superimposed over each other during processing.

Figure 3:
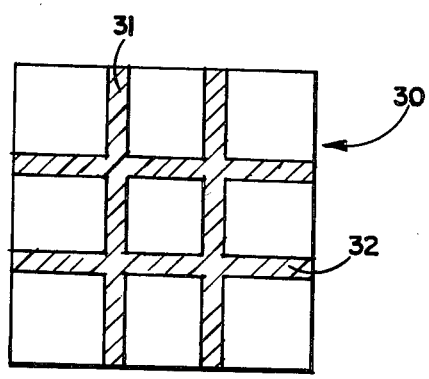
FIG. 3 is a representation of the pattern of Moire fringe effects produced when patterns in FIGS. 1 and 2 are aligned.

Referring to FIG. 3, there is shown a "tic-tac-toe" pattern which is symmetrical in the X and Y coordinate. With this pattern, the vertical lines 31 and the horizontal lines 32 are symmetrically oriented within the pattern field which is defined by the dimensions of patterns 10 and 20. If, on the other hand, the patterns and, thus, the substrate and mask were misaligned in the X or Y direction, the horizontal or vertical lines (or both) would be misaligned from the symmetrical position. That is, the vertical lines 31 could be misaligned toward the left or right side of the pattern while the horizontal lines 32 can be misaligned toward the top or bottom of the pattern. By observing the direction of misalignment of the image the direction of misalignment of mask and substrate, i.e. X or Y axis, can be ascertained and the appropriate correction mode.

Figure 4:
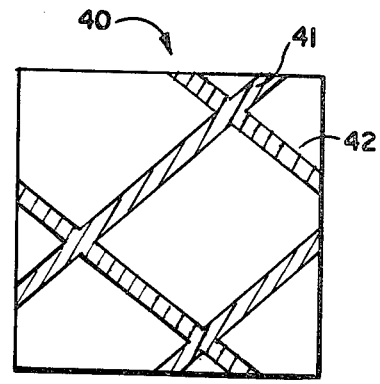
FIG. 4 is a representation of the pattern Moire fringe effects produced when the patterns of FIGS. 1 and 2 are misaligned.

Referring to FIG. 4, there is shown pattern 40 having skewed lines 41 and 42 which are from the lower left to the upper right and from the lower right to the upper left portions of the pattern, respectively, in this illustration. This pattern indicates a misalignment between patterns 10 and 20 in the $\theta$ direction. That is, the mask and substrate have become rotated relative to each other. By rotating the mask or substrate, the $\theta$ distortion can be eliminated. If necessary, the X and Y distortion or misalignment can be corrected as well.

Figure 5:
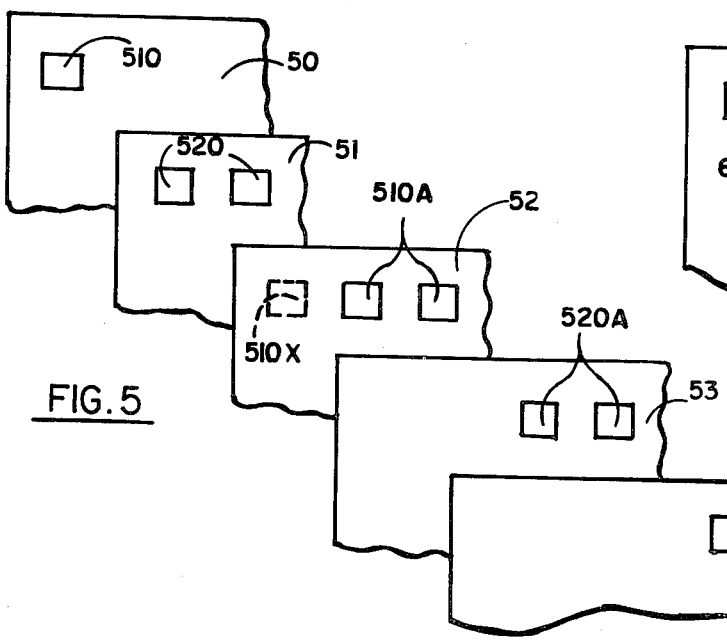
FIG. 5 is a schemaic representation of the inventive technique wherein a plurality of masks are consecutively superimposed one on the other to establish alignment thereof in a typical fabrication process.

Referring now to FIG. 5, there is shown a schematic representation of the position of a plurality of masks relative to a substrate. As is well known, in most semiconductor related processes, a plurality of masks are sequentially applied to a substrate to define different features or portions of the device in the substrate during the processing operation. In this example, substrate 50 is provided while masks 51, 52, 53 and 54 are also provided. It is understood that the masks are shown in the same figure that are actually utilized sequentially. That is, mask 51 is used to perform a function or process and is then removed and/or replaced by mask 52. Similarly, mask 53 replaces mask 52, mask 54 replaces mask 53, and the like. Of course, some of the masks may be superimposed over preceding masks. Also, more, or fewer, masks can be utilized. However, those details are a function of the process and are immaterial to the operation of the apparatus and technique of this invention.

Typically, substrate 50 has applied thereto a suitable pattern 510 which, for sake of example, is defined as similar to pattern 10 in FIG. 1. Mask 51 which is to be superimposed over substrate 50 during the process has a plurality of patterns 520 disposed thereon. Patterns 520 are similar to patterns 20 in FIG. 2. In actual operation, one of patterns 520 is superimposed over pattern 510 to determine alignment. In typical operation, the left-most pattern 520 would be aligned with pattern 510. When the alignment is found to be proper, the operation defined by mask 51 is undertaken. In addition, patterns 520 are transferred to substrate 50. Consequently, the dual (superimposed) image of patterns 510 and 520 is provided in the area of pattern 510 while a clear impage of pattern 520 is formed on substrate 50.

Subsequently, mask 52 is placed over substrate 50 in such a manner that patterns 510A (which are identical to patterns 510) are superimposed over patterns 520. The area shown in dashed outline 510X is the area represented or associated with pattern 510 on substrate 50. Of course, an additional pattern could be provided on mask 52 but is unnecessary and does not aid in alignment. The left most pattern 510A is now used to align with the right most pattern 520 which has been previously transferred from mask 51 to substrate 50. The same type of operation continues with masks 53 and 54 sequentially supplanting masks 51 and 52. The patterns are continuously applied to substrate 50 with superimposed patterns being discarded and a clear pattern being produced.

Figure 6:
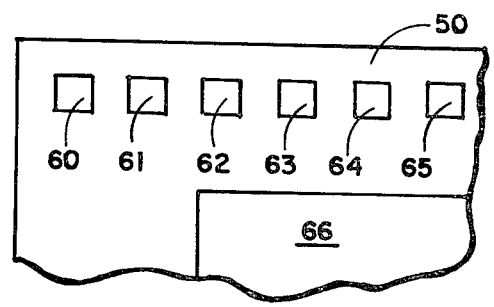
FIG. 6 is a schematic representation of a finished product including the patterns produced by the respective alignment patterns during the processing.

Consequently, as shown in FIG. 6, the array of patterns 60 through 65 are produced at the edge of substrate 50. Patterns 60 through 64 may be superimposed and, therefore, essentially useless for alignment purposes of patterns. Pattern 65, can be a clear pattern which is produced by the last process step. Of course, it may be appropriate that the last mask would only include a single pattern. Therefore, pattern 65 could also be superimposed. Patterns 60 through 65 are placed in a portion of the substrate 50 which is not essential to the device operation wherein the field or area 66 represents the useful portion of the chip or device on substrate 50.

It should be understood, of course, that the instant pattern and apparatus is equally useful for transmitted or reflected light, white light, ultraviolet light, infrared or the like. That is, if substrate 50 is fabricated of an insulating material such as sapphire, garnet or the like, the radiation to which it is transparent has a characteristic photon energy which is less than the bandgap of the material, such as visible light. If substrate 50 is a semiconductor material such as silicon, gallium arsenide or the like, the radiation to which it is transparent is typically in the infrared region. Consequently, it is possible to use light (suitable energy) transmitted through the substrate and the mask. Transmitted light is strongly absorbed by fiducial markings created during the previous masking and/or etching step to accomplish alignment by the Moiré technique. The transmitted radiation can be detected optically with the aid of commercially available devices. Transmitted radiation can be visible light or it can be infrared light energy as noted above. In this instance, the transmitted radiation is detected optically with the aid of a commercially available infrared-to-visible converter mounted on the alignment optics in any suitable fashion. The light source behind the wafer or substrate can, typically, be a tungsten filament, an infrared laser diode or the like. Of course, patterns on the mask and substrate must have mating fiducials. The mask and substrate must also be transparent to the infrared radiation as in the case of glass, mylar, or silicon.

Thus, there is shown and described an apparatus and technique for achieving registration between multilayer patterns with an accuracy which has been shown to be on the order of 0.1 microns. Registration can be performed with alignment devices. It can be used with exposure systems employing X-rays, E-beams, visible light, ultraviolet light or the like. In addition, it can be used with both transmitted and reflected light, although transmitted light is believed preferable. The types of materials for the mask and substrate are limited only by the environmental aspects of the apparatus such as the light source and the like.

Those skilled in the art may perceive certain modifications which can be made to the apparatus. However, any modifications which fall within the purview of this description are intended to be included therein as well. The description is intended to be illustrative only and is not intended to be limitative. Rather, the scope of the invention is defined by the claims appended hereto.

Having thus described the preferred embodiment of the invention, what is claimed is:

1. Apparatus for high precision alignment of a mask and a substrate in the manufacture of microelectronic devices comprising, first pattern means comprising a plurality of northogonal lines and spaces which form a first grid, each of said lines and spaces of said first pattern means having a first prescribed width, second pattern means comprising a plurality of $n-2$ orthogonal lines and spaces which form a second grid, each of said lines and spaces of said second pattern means having a second prescribed width, one of said first and second pattern means formed on said mask and the other of said first and second pattern means formed on said substrate, said first and second pattern means adapted to produce moire images as a function of the relative alignment of said first and second pattern means on said mask and substrate.

2. The apparatus recited in claim 1 wherein
said lines and spaces of said first pattern means have a prescribed width d, and
said lines and spaces of said second pattern means have a prescribed width $d + \Delta$.

3. The apparatus recited in claim 1 wherein
said first and second pattern means are squares with side dimensions w.

4. A method of aligning a plurality of items comprising the steps of, forming the apparatus recited in claim 1,
  superimposing said first and second pattern means with respect to each other, and
  observing the image produced by the superimposed pattern means until a preferred image is produced to indicate a preferred alignment.

5. The method recited in claim 4 comprising the steps of,
  forming said first pattern on said substrate,
  forming a plurality of said second patterns on a first mask,
  aligning said mask and said substrate by means of said first pattern and one of said second patterns on said mask,
  transferring the other of said plurality of said second patterns to said substrate to provide another pattern for alignment on said substrate,
  forming a plurality of said first patterns on a further mask, and
  aligning said substrate and said further mask by means of said patterns thereon.

6. The method recited in claim 5 comprising the steps of continuing to form patterns on subsequent masks which patterns alternate in terms of the first or second pattern being applied to alternate masks.

7. The apparatus recited in claim 1 wherein
  said items include substrates which are transparent to radiation which has a characteristic photon energy.

8. The apparatus recited in claim 1 wherein
  said terms include at least one mask which is transparent to radiation which has a characteristic energy.

9. The apparatus recited in claim 8 wherein
  said items include at least one substrate which is transparent to radiation which has a characteristic energy.

10. The apparatus recited in claim 1 wherein,
  said image is symmetrical when said first and second patterns are in alignment and is asymmetrical when said first and second patterns are misaligned.

11. The apparatus recited in claim wherein,
  said mask includes a plurality of said patterns thereon.

* * * * *

UNITED STATES PATENT AND TRADEMARK OFFICE
CERTIFICATE OF CORRECTION

PATENT NO. : 4,193,687
DATED : March 18, 1980
INVENTOR(S) : John P. Reekstin et al It is certified that error appears in the above-identified patent and that said Letters Patent are hereby corrected as shown below:

In column 1, line 17, please delete "of" and insert --or--.

In column 1, line 27, please delete the "s" in the word "techniques".

In column 2, line 56, please delete "mode" and insert --made--.

In column 2, line 8, please delete "time" and insert --times--.

In column 3, line 30, please delete "impage" and insert --image--.

In column 3, line 34, please delete "patterns" and insert --pattern--.

In column 5, line 2, please begin a new paragraph starting with the word "forming".

In column 6, line 4, please begin a new paragraph starting with the word "continuing".

In column 6, line 11, please delete "terms" and insert --items--.

In column 6, line 21, please insert --1-- before the word "wherein".

Signed and Sealed this

Thirtieth Day of March 1982

[SEAL]

Attest:

GERALD J. MOSSINGHOFF

*Attesting Officer*     *Commissioner of Patents and Trademarks*